United States Patent [19]

Tobuse

[11] Patent Number: 4,870,286
[45] Date of Patent: Sep. 26, 1989

[54] ELECTRON BEAM DIRECT DRAWING DEVICE

[75] Inventor: Hiroaki Tobuse, Hyogo, Japan

[73] Assignee: Mitsubishi Denki Kabushiki Kaisha, Tokyo, Japan

[21] Appl. No.: 227,009

[22] Filed: Jul. 29, 1988

[30] Foreign Application Priority Data

Jul. 30, 1987 [JP] Japan ................................. 62-188888
Nov. 4, 1987 [JP] Japan ................................. 62-277497

[51] Int. Cl.⁴ ............................................ H01J 37/302
[52] U.S. Cl. .................................. 250/492.2; 250/398
[58] Field of Search ................ 250/492.22, 492.2, 398

[56] References Cited

U.S. PATENT DOCUMENTS 4,692,579  9/1987  Saitou et al. ..................... 250/492.2

FOREIGN PATENT DOCUMENTS 56-48136  5/1981  Japan ............................. 250/492.22

Primary Examiner—Jack I. Berman
Attorney, Agent, or Firm—Oblon, Spivak, McClelland, Maier & Neustadt

[57] ABSTRACT

An electron beam direct drawing device for use in manufacturing a printed circuit board having a photoresist thereon according to a drawing pattern information obtained by a computer aided printed circuit board pattern design, comprises means for dividing the drawing pattern information over a whole area of the printed circuit board into a plurality of fields each capable of being scanned by electron beam and for re-editing drawing patterns of the respective fields, means for storing the divided and then re-edited drawing pattern information, means for generating a first control signal for reading out the stored drawing pattern information sequentially and performing a main deflection of electron beam by means of a main deflector and means for generating a second control signal for deriving, from the stored drawing pattern information, information assigning an orientation of a pattern to be drawn and a scan width of a sub-deflection and for performing a predetermined sub-deflection scanning by means of a sub-deflector, whereby electron beam scans the printed circuit board under a control of a combination of the main deflection and the sub-deflection. A clock generator capable of producing a plurality of clock signals each corresponding to a specific line width of the pattern is provided to expose the line with electron beam of optimum dose.

4 Claims, 6 Drawing Sheets

ELECTRON BEAM DIRECT DRAWING DEVICE

BACKGROUND OF THE INVENTION

The present invention relates to a direct drawing device for drawing a predetermined pattern on a photoresist layer on a printed circuit board by scanning it directly with an electron beam.

A substrate patterning technique has been used in manufacturing semiconductor devices or printed circuit boards in which an art work film bearing thereon a predetermined pattern is put on a photoresist layer formed on the semiconductor substrate or the printed circuit board, which is sensitive to ultra-violet rays, and exposed to ultra-violet rays and a copper foil pattern, i.e., bare board, is formed after developing and etching thereof. The art work film is usually prepared by a drawing machine called a photo plotter or laser plotter. A drawing pattern data which is given by a computer aided printed circuit board design is supplied to the plotter in which it is converted into a data of a suitable format which is referred to as "Gerber Format" which is composed of a code corresponding to a line width of a pattern and a code assigning a start point cordinate (Xs, Ys) and an end point coordinate (Xe, Ye) of each line segment thereof and a code showing whether or not these line segments are to be exposed and represents a group of patterns over a large circuit board area such as 340 mm×400 mm or 500 mm×600 mm.

Recently, in order to eliminate the necessity of preparation of the art work film and to reduce a manufacturing cost and time as well as to match with a requirement of production of various semiconductor devices or printed circuit boards each small in number, an electron beam direct exposing system has been developed, in which a predetermined pattern is drawn on a semiconductor wafer or a mask plate by scanning it with an electron beam. In order to make such a direct exposing system usable with the conventional plotter, it is desired that the direct exposing system is responsible to the computer aided design (CAD) output pattern information of the Gerber Format and able to convert it into a suitable format to the system.

In the direct exposing system, when a large area is to be drawn by scanning it with the electron beam while the area is kept stationary, a peripheral portion of the field is irradiated with the electron beam at a small incident angle causing positions of exposition at upper and lower surfaces of the phoresist layer to be different, resulting in a degradation of positional accuracy of a resultant pattern. In order to solve this problem, it is considered to make a work distance between the circuit board and a deflector large enough to obtain a sufficiently large incident angle of electron beam. In this case, however, it becomes difficult to condense the electron beam and the latter may be scattered by residual gas and thus influenced by residual magnetism due to a long beam path. Therefore, the area to be scanned by electron beam should be limited to, for example, 100 mm×100 mm which can be scanned by a main deflector, i.e., main deflection regions (referred to as "field", hereinafter), and the respective fields are drawn by the so-called "step and repeat" system one by one by relatively moving the field with respect to electron beam. Therefore, it is necessary that a pattern data over the whole area is divided every field and then edited again. It has been usual to divide a region which can be covered by an electron beam deflected by a main deflector into a plurality of sub-deflection regions (referred to as "sub-field", hereinafter) each covered by a sub-deflector and to shift electron beam from one sub-field to another by the main deflector every time a drawing for the one sub-field completes to thereby complete a drawing of the whole field.

This system is disclosed in, for example, Japanese Patent Application Laid-open No. 244024/1985 and FIG. 4 of the present application shows a portion of a conventional electron beam exposing device having a two-step deflector disclosed therein.

In FIG. 5, electron beam 1 is directed through a blanker 2, an aperture 3, a sub-deflector 4 and a main deflector 5 to a material 6 such as a semiconductor wafer or a mask plate thereon. A region of the material 6 surrounded by a solid line is a field and regions thereof surrounded by dotted lines are sub-fields. A control circuit for controlling the electrooptical system mentioned above is also shown in block in FIG. 4 in which a computer 7 is connected through a drawing data memory 8, a pattern decomposer circuit 9, a sub-deflection correcting circuit 10 for correcting distorsion of sub-deflection, a dot decomposer circuit 11 for a small region and a sub-deflection digital/analog converter (DAC) 12 to the sub-deflector 4 and through a correction coefficient calculator circuit 13 and a main deflector DAC 14 to the main deflector 5. The sub-deflection correction circuit 10 is connected to the correction coefficient calculation circuit 13 and through a blanking amplifier 15 to the blanker 2.

FIG. 6 illustrates an example of drawing operation to be performed by the conventional electron beam exposing device. A left side portion of FIG. 6 shows the material 6 and a right side portion thereof shows one (22) of the sub-fields in the field 21 in enlarged scale. A pattern 23 in the sub-field 22, such as trapezoidal pattern, is divided into seven small regions (paint-out fields). One (24) of the paint-out fields is painted out digitally in dot by point electron beam 1.

In operation, a deflection of electron beam 1 from one sub-field to another is performed by the main deflector 5 and a deflection thereof within each sub-field is performed by the sub-deflector 4. The computer 7 supplies a drawing data to the drawing data memory 8 and a deflection distortion data to the correction coefficient calculator circuit 13. One of outputs of the calculator circuit 13, which assigns a center of the sub-field in the field after correction of its deflection distortion, is supplied to the main deflector DAC 14. The pattern decomposition circuit 9 divides the pattern in the sub-field into the paint-out regions on the basis of the pattern data received from the drawing data memory 8. The sub-deflection correcting circuit 10 receives another output of the correction coefficient calculator circuit 13 which is a deflection correcting coefficient for each sub-field and performs a distortion correction according thereto, a resultant corrected sub-deflection signal being supplied to the dot decomposer circuit 11 in which each paint-out field is decomposed to dots which are supplied to the sub-deflection DAC 12.

The blanking amplifier 15 responds to the output of the sub-deflection correcting circuit 10 to perform a blanking operation at both a start point and an end point of the paint-out field so that electron beam 1 is on-off controlled thereby.

The drawing data memory 8 stores pattern informations of the respective sub-fields of the field which are prepared by the computer 7 by dividing the field.

As mentioned previously, this proposal requires the division of the pattern data of the large area into those of the fields and the re-edition thereof and additionally the division of pattern data of each field into those of the sub-fields and the re-edition thereof. When these operations are to be performed by a computer, the amount of software necessary to the divisions and the re-editions becomes considerable and the amounts of data and processing time become also considerable, respectively. When it should be performed by a hardware, it is necessary to provide, a circuit for automatically dividing the field pattern data to the respective sub-field pattern data. Thus, in either case, the processing of the data becomes complicated and time consuming. Further, unlike the wafer or mask pattern for semiconductor device, it is usual that the pattern of printed circuit board does not include identical pattern portions occuring repeatedly. Therefore, it is impossible to simplify the data processing by using features of such repeatedly occurring identical pattern portions.

SUMMARY OF THE INVENTION

An object of the present invention is to provide an electron beam direct drawing device which is capable of drawing a data pattern highly precisely through a through-put process including a data processing on the basis of output pattern data of the CAD in such a way that, in scanning and exposing a printed circuit board having large area with an electron beam, drawing pattern data of a field which are divided and then re-edited complete a drawing of the pattern without necessity of a further division to sub-fields.

Another object of the present invention is to provide an electron beam direct drawing device which is capable of providing a high quality drawing on a printed circuit board by controlling a dose of electron beam to an optimum value regardless of variation of width of pattern to be drawn so that an optimum exposure is always obtained.

According to a first aspect of the present invention, the above objects can be achieved by an electron beam direct drawing device comprising means for dividing a CAD output drawing pattern information over a whole area of a printed circuit board into a plurality of fields and for re-editing drawing patterns of the respective fields, means for storing the divided and then re-edited drawing pattern information, means for reading out the stored drawing pattern information sequentially and performing a main deflection of electron beam by means of a main deflector and means for deriving, from the stored drawing pattern information, information assigning an orientation of a pattern to be drawn and a scan width of a sub-deflection and for performing a predetermined sub-deflection scanning by means of a sub-deflector.

According to a second aspect of the present invention, the above objects can be achieved by providing an electron beam direct drawing device comprising means for storing a drawing pattern information corresponding to a field capable of being scanned by a main deflector, means for reading out the stored drawing pattern information sequentially and performing a main deflection of electron beam by means of a main deflector, means for producing a plurality of signals having rectangular waveforms and having different frequencies, means for deriving, from the stored drawing pattern information, an information assigning a width of sub-deflection scan and for selecting one of the rectangular signals, means for producing a main deflection scanning data in synchronism with the selected rectangular signal and means for deriving, from the stored drawing pattern information, information assigning an orientation of a pattern to be drawn and a scan width of a sub-deflection and for performing a predetermined sub-deflection scanning by means of a sub-deflector.

In the present invention, pattern drawings of respective fields which once divided and re-edited are performed at high speed in each interval between main deflection scannings in real time as patterns having a predetermined width without necessity of sub-division thereof. Further, dose of electron beam is always controlled to an optimum value even if the pattern width is varied, realizing an optimum exposure for various patterns in the fields.

DETAILED DESCRIPTION OF THE PREFERRED EMBODIMENTS

Figure 1:
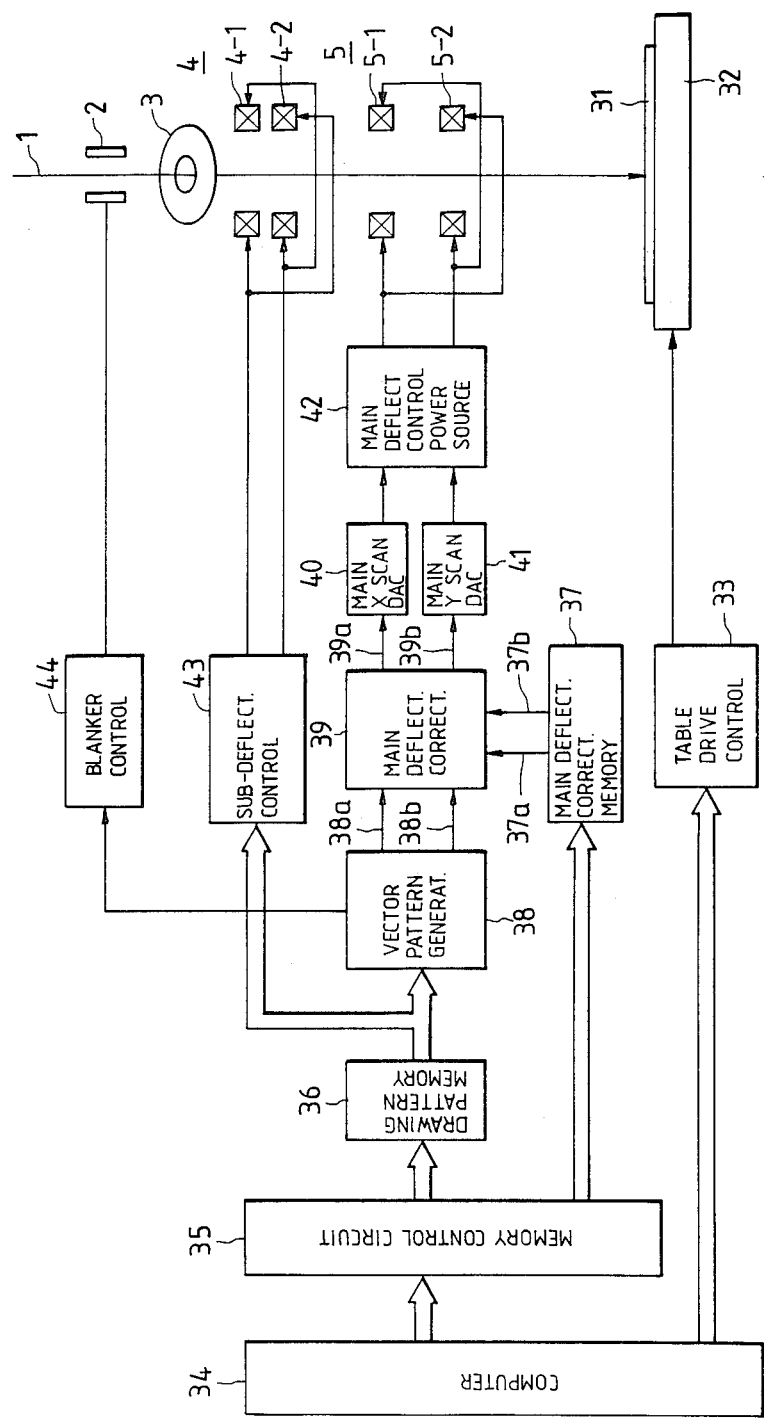
FIG. 1 is a block diagram of an embodiment of the present invention.
Figure 5:
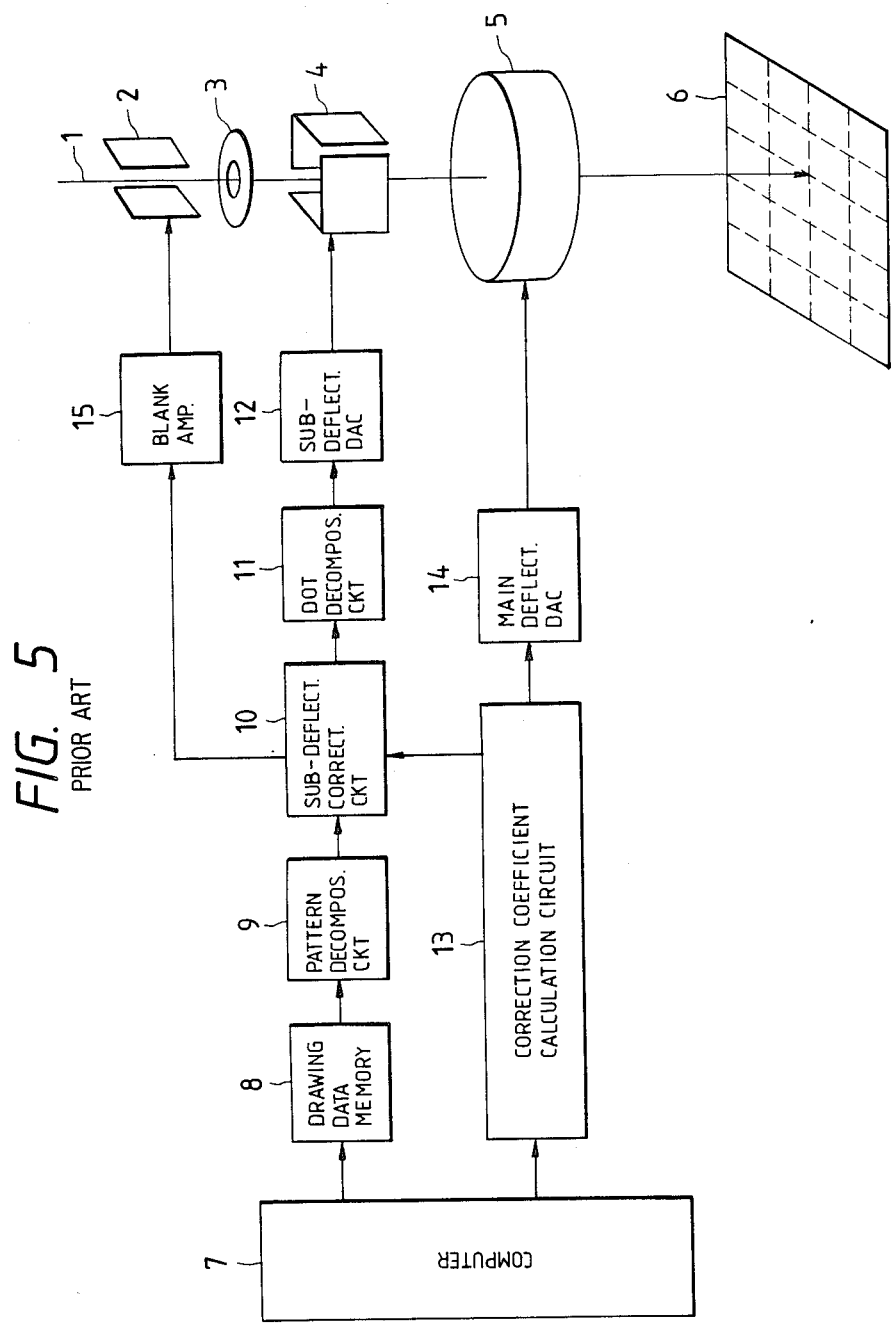
FIG. 5 is a block diagram showing a conventional device.
Figure 6:
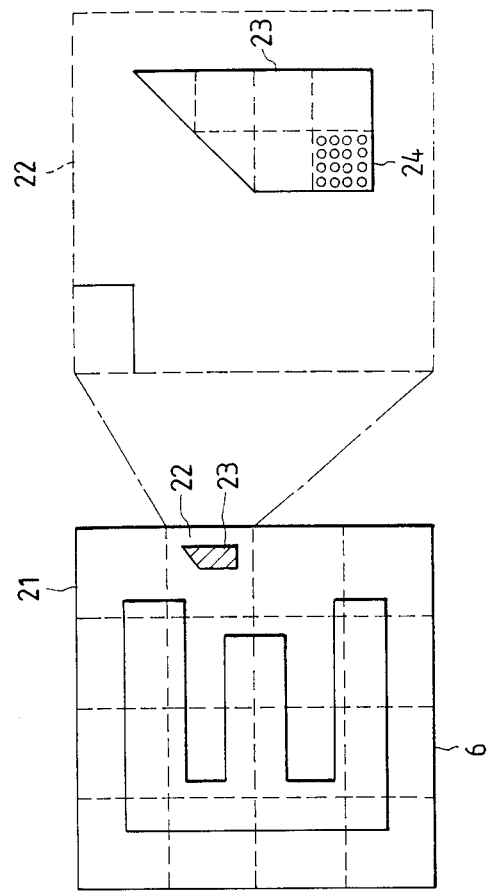
FIG. 6 shows a field in FIG. 5 in enlarged view.

In FIG. 1 which shows an embodiment of an electron beam direct drawing device according to the present invention, an electrooptical system composed of a blanker 2, an aperture 3, a sub-deflector 4 and a main deflector 5 is substantially the same as that shown in FIG. 5 and disposed in a reduced pressure environment. Therefore, details thereof are omitted in this description for avoidance of duplication. However, the sub-deflector 4 of this embodiment is constituted with a deflection coil 4-1 for scanning in X direction and a deflection coil 4-2 for Y direction scanning and the main deflector 5 of this embodiment is constituted with an X direction scanning coil 5-1 and a Y direction scanning coil 5-2. Electron beam 1 passed through the electrooptical system impinges a printed circuit board substrate 31 having a photoresist thereon. The substrate 31 is supported on a XY table 32 which is driven in X and Y directions according to instructions from a table control system 33. The XY table 32 having the substrate 31 thereon is disposed in reduced pressure environment. The drawing device is composed of a computer 34, a memory control circuit 35 connected to an output side of the computer 34, a drawing pattern memory 36 connected to an output of the memory control circuit 35, a main deflection correcting memory 37 connected to the output of the memory control circuit 35 and storing distortion correcting data for correcting distortion of deflection usually existing in the electrooptical system, a vector pattern generator circuit 38 responsive to a pattern data from the drawing pattern memory 36 to generate deflection scanning data, a main deflection correcting circuit 39 responsive to the deflection scanning data from the vector pattern generator circuit 38 and the distortion correcting data from the main deflection correcting memory 37 to generate a corrected deflection scanning data, a main deflection X scan DAC 40 connected to an output of the main deflection correcting circuit 39, a main deflection Y scan DAC 41 connected to the output of the main deflection correcting circuit 39, a main deflection control power source 42 for supplying control power to the main deflection X and Y scan DACs 40 and 41 and the X and Y main deflection coils 5-1 and 5-2, a subdeflection control circuit 43 connected between the drawing pattern memory 36 and the sub-deflector 4 and a blanker control circuit 44 connected between the vector pattern generating circuit 38 and the blanker 2 for on-off controlling the electron beam 1 at start/end times of drawing for each field.

Figure 2:
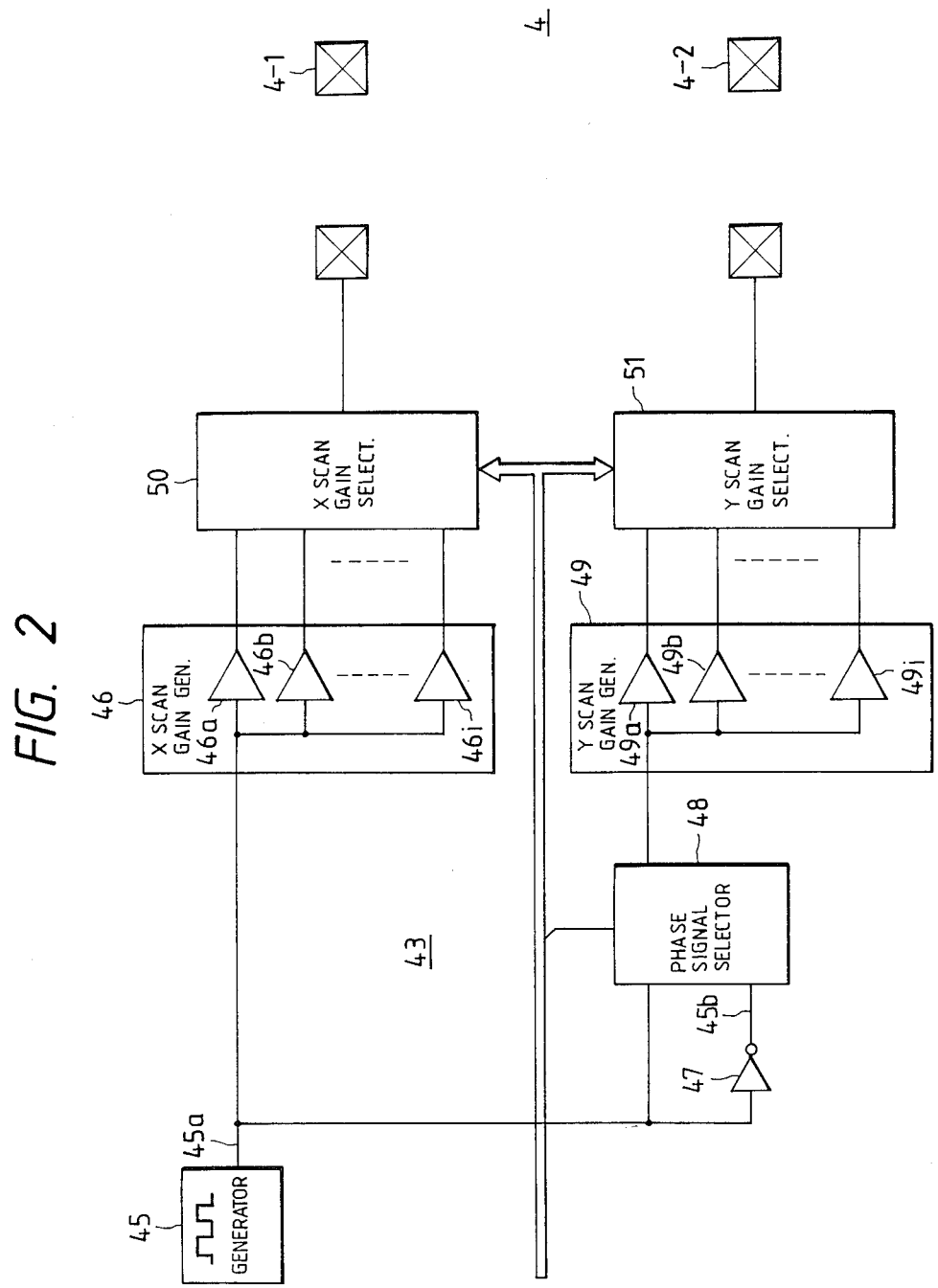
FIG. 2 is a block diagram showing a sub-deflection control circuit in FIG. 1 in more detail.

FIG. 2 is a block circuit diagram of the subdeflection control circuit 43 in FIG. 1. The sub-deflection control circuit 43 includes a periodic rectangular waveform generating circuit 45 whose output signal 45a is supplied, directly, to a X scan gain generator circuit 46 and to a phase signal selection circuit 48 to which a signal 45b which is obtained by inverting the signal 45a by an inverter 47 is also supplied. The phase signal selection circuit 48 functions to select either the signal 45a or 45b according to a digital input value supplied from the drawing pattern memory 36 and supplies a selected signal to a Y scan gain generating circuit 49. The X scan gain generating circuit 46 is composed of a plurality of amplifiers 46a, 46b, . . . 46i and the Y scan gain generating circuit 49 is composed of the same number of amplifiers 49a, 49b, . . . 49i. The amplifiers 46a and 49a amplify original signal na times, the amplifier 46b and 49b amplify it nb times, and so on. na, nb, . . . ,ni are set preliminarily such that a sub-deflection scanning of a predetermined width can be performed on the substrate 31, respectively. Since the pattern width takes discrete values such as 70 μm for ultra X class, 130 μm for X class and 250 μm for Y class, the number of the amplifiers having preset multiplication factors is not infinite.

An X scan gain selection circuit 50 responds to a pattern data from the drawing pattern memory 36 and selects one of outputs of the amplifiers 46a to 46i and a Y scan gain selection circuit 51 responds thereto and selects one of outputs of the amplifiers 49a to 49i.

In operation, an output (drawing pattern informat ion of Gerber format) of a printed circuit board pattern design CAD (not shown) is supplied through an on-line communication line or a magnetic tape, etc., to the computer 34 in which it is divided to drawing pattern informations for respective fields. This process of converting the pattern data into information for the various fields is referred to as "re-editing". This re-edited data is converted into binary data (referred to as "direct drawing pattern information", hereinafter) suitable for use in the direct drawing device. The direct drawing pattern information includes binary digital values of, for example, a coordinates (X, Y) of the start point of drawing, length of line segment, orientation and subdeflection gain information for each line segment of the drawing pattern.

Prior to a commencement of the drawing operation, the direct drawing pattern information and the main deflection correcting data are supplied by the computer 34 through the memory control circuit 35 to the drawing pattern memory 36 and the main deflection correcting memory 37 and stored therein. At the start of the direct drawing, data concerning to a start point (X, Y) coordinates, length and orientation of one line segment are readout from the drawing pattern memory 36 and supplied to the vector pattern generating circuit 38. The latter circuit is constituted with an electronic logic circuit such as counter and provides an X scan data 38a and a Y scan data 38b in digital form as X and Y scan control signals for the main deflector 5 in response to the above mentioned three data. The scan data 3a and 38b are supplied to the main deflection correction memory 39 in which a main deflection correcting operation is performed in real time according to the correction data from the main deflection correction memory 37, i.e., an X scan correction data 37a and a Y scan correction data 37b, and, after the correction is completed, supplied to the main deflection X and Y scan DACs 40 and 41 as a corrected X scan data 39a and corrected Y scan data 39b, respectively. The corrected X and Y scan data 39a and 39b are converted by the respective DACs 40 and 41 into analog signals which are supplied to the main deflection control power source 42, upon which the latter supplies certain currents to the main deflection X and Y coils 5-1 and 5-2 to perform the main deflection scanning.

When the main deflection scanning for the one line segment is completed, data for a next line segment are readout from the drawing pattern memory 36 and the same operation is repeated for the next line segment, and so on. Thus, a predetermined drawing can be performed on the basis of the pattern in the field.

Figure 3A:
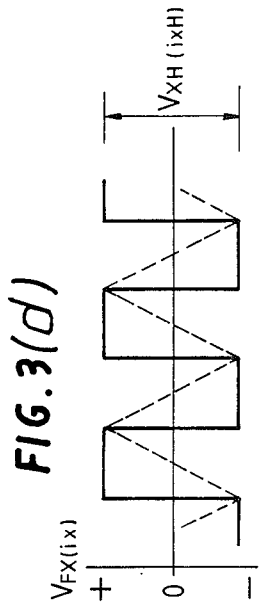
FIG. 3a–3f shows waveforms and graphs useful to understand an operation of the sub-deflection control circuit.
Figure 3B:
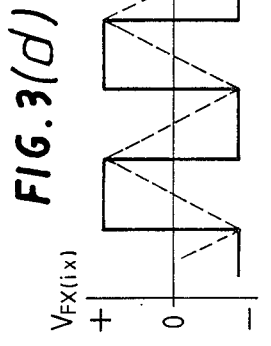

The sub-deflection scanning will be described in detail with respect to FIG. 2, when the X sub-deflection coil 4-1 and the Y sub-deflection coil 4-2 are supplied with such rectangular in-phase voltages $V_{FX}$ and $V_{FY}$ having amplitudes $V_{XH}$ and $V_{YH}$, as shown in FIGS. 3a and 3b, respectively, current variations $i_X$ and $i_Y$ having amplitudes $i_{XH}$ and $i_{YH}$ shown by dotted lines in the same figures are produced in the sub-deflection coils 4-1 and 4-2, respectively. In this case, the following relations are established between a sub-deflection direction 8 and deflection width $L_{XY}$ of electron beam 1 on the substrate 31:

$$\theta = \tan^{-1}\left(\frac{V_{YH}}{V_{XH}}\right) = \tan^{-1}\left(\frac{i_{YH}}{i_{XH}}\right)$$

$$L_X = L_{XY} \cdot \cos\theta = KV_{XH} = K'i_{XH}$$

$$L_Y = L_{XY} \cdot \sin\theta = KV_{YH} = K'i_{YH}$$

where K and K' are constant and $L_X$ and $L_Y$ are an X and a Y components of the deflection width $L_{XY}$.

Figure 3C:
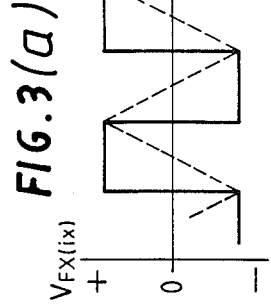
Figure 3D:
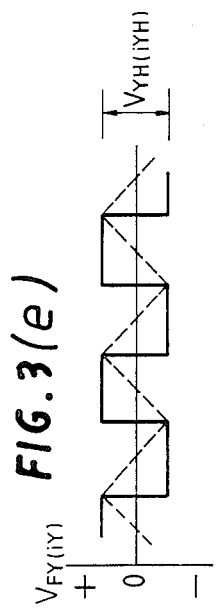
Figure 3E:
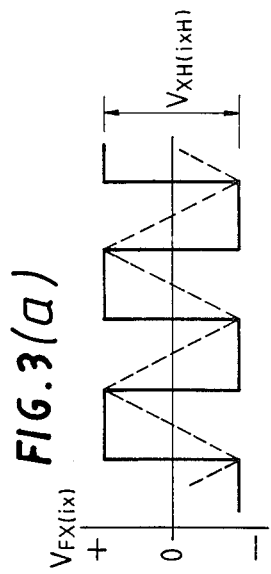
Figure 3F:
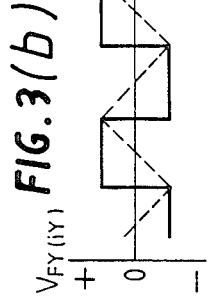

FIG. 3c shows a movement of electron beam 1 on the substrate 31. Since the rectangular voltages $V_{FX}$ and $V_{FY}$ are in phase, electron beam 1 moves in the first and the third quadrants as shown. When the voltages $V_{FX}$ and $V_{FY}$ are different in phase by 180° as shown in FIGS. 3d and 3e, electron beam 1 moves in the second and the fourth quadrants as shown in FIG. 3f. Chain lines in FIGS. 3c and 3f show the main deflection scan direction.

An operation of the sub-deflection control circuit 43 will be described. Orientation and sub-deflection gain information among other data for one line segment of a pattern readout from the drawing pattern memory 36 are supplied to the X scan gain selection circuit 50 and the Y scan gain selection circuit 51. It is assumed at this time that the main deflection scanning is performed in a direction parallel to the X axis according to data of a start point coordinates (X, Y), length and orientation of one line segment readout from the drawing pattern memory 36, as an example. That is, ψ=0° or 180° in FIGS. 3c and 3f. In such case, the X scan gain selection circuit 50 selects an output of the amplifier 46a, i.e., the signal 45a, and the Y scan gain selection circuit 51 selects an output of the amplifier 49i. As a result, no sub-deflection amplitude is given to the X scan coil 4-1 and a rectangular voltage having magnitude ni times that of the original signal is given to the Y sub-deflection coil 4-2 to give a predetermined deflection in a direction (Y axis direction) orthogonal to the main deflection direction (X axis direction).

When the main scanning is being performed in the Y axis direction (ψ=90° or 270°), the X and Y scan gain selection circuits 50 and 51 select outputs of the amplifiers 46i and 49a, respectively, to give a predetermined subdeflection in a direction (X axis direction) orthogonal to the direction of the main deflection.

When the phase signal selection circuit 48 selects in-phase rectangular signals and the X and Y scan gain selection circuits 50 and 51 select the outputs of the amplifiers 46b and 49i, respectively, a sub-deflection scanning satisfying $$\theta = \tan^{-1}\frac{n_i}{n_b} \quad (0° < \theta < 90°)$$

is obtained and, when the circuit 48 select rectangular signals opposite in phase, a sub-deflection satisfying $$\theta = \tan^{-1}\frac{n_i}{n_b} \quad (90° < \theta' < 180°)$$

is obtained. Thus, it is possible to sub-scan in a direction normal to the main deflection in any direction other than vertical or horizontal direction.

Figure 4:
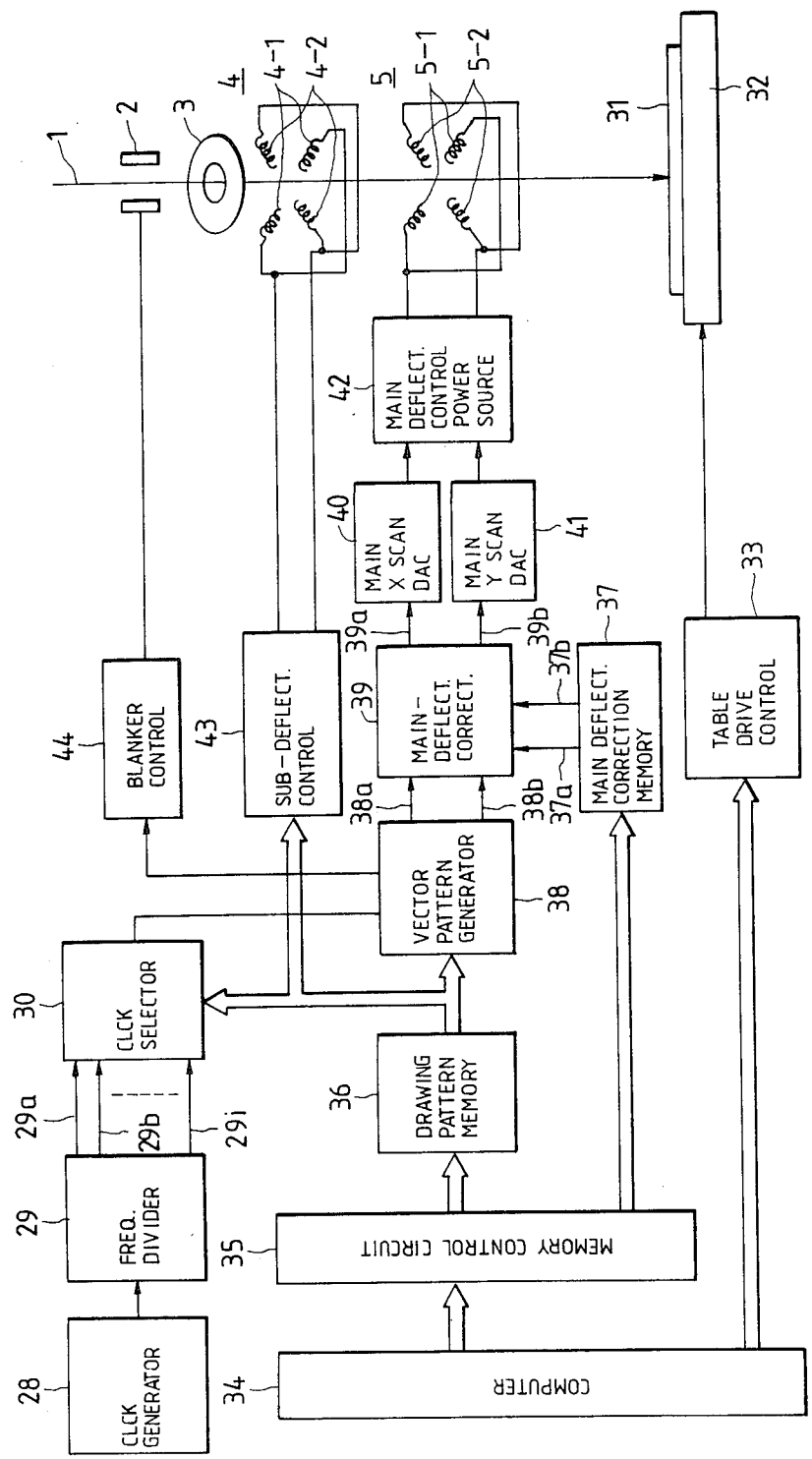
FIG. 4 is a block diagram of another embodiment of the present invention.

FIG. 4 shows another embodiment of the present invention which differs from the embodiment shown in FIG. 1 in only that an optimum electron dose control circuit is further included. The optimum dose control circuit comprises a clock circuit 28 for generating a rectangular clock signal having a constant frequency $f_M$, a frequency divider 29 for frequency dividing the clock signal to produce rectangular signals having frequencies $f_a, f_b, \ldots, f_i$ on signal lines 29a, 29b, ..., 29i and a clock selection circuit 30 for selecting one of the frequencies fa to fi. The frequency selected by the clock selection circuit 30 is supplied to a vector pattern generating circuit 38 which is the same as that shown in FIG. 1 and used as a reference timing clock signal for generation of the main scan data. The optimum dose control circuit functions to control electron beam dose to an optimum value even if the width of pattern line varies, so that an optimum exposure is always obtained to improve the quality of drawing. Since a construction of other portion of this embodiment than the optimum dose control circuit and an operation thereof are the same as those of the embodiment shown in FIG. 1, an operation of the latter circuit will be described.

In FIG. 4, among the data readout from the drawing pattern memory 36, the sub-deflection gain information in digital form is also supplied to the clock selection circuit 30, upon which the latter circuit 30 selects one of the frequencies $f_a$ to $f_i$ as a main scan control clock $f_M$ so as to keep the exposing dose constant with respect to the pattern width to be drawn, i.e., scan width d of sub-scan, and supplies it to the vector pattern generating circuit 38.

A scan area $S(m^2)$ which can be scanned by sub-deflection within a time $t_M(sec)$ necessary to move the main deflection beam in response to a variation of main deflection scan corresponding to one bit of digital data is expressed by the following equation;

$$S = \phi \cdot d \quad (1)$$

where $\phi$ is a beam spot diameter in meters.

On the other hand, there is an optimum amount of charge, i.e., dose D (Coulomb/$m^2$), to expose a unit area of the photoresist, which can be expressed by $$D = (I \cdot t_M)/S \quad (2)$$

where I is electron beam current in ampere.

Therefore, the following relation is obtained from the equations (1) and (2)

$$t_M = (\phi \cdot D)d/I \quad (3)$$

Since $t_M = 1/f_M$, the equation (3) can be transformed into the following equation by controlling $t_M$ by clock frequency $f_M$ (Hz)

$$f_M = (I/(\phi \cdot D)) \cdot (1/d) \quad (4)$$

This means that, in order to control the dose D always optimum according to the sub-scan width d while the beam current I is kept constant, it is necessary to change the main scan control clock.

Also, from the equation (4), it is clear that the dose D can be kept constant with respect to variation of the sub-scan width by controlling the beam current I while keeping the clock frequency $f_M$ constant. However, the drawing under control of the beam current provides problems such as (1) It is necessary for wide pattern line to use an electron tube having a cathode of a diameter large enough to derive a large beam current and such larger cathode causes beam condensation to be degraded.

(2) When the beam current is controlled by controlling a grid voltage of the electron tube, a focus point may fluctuate due to a large variation of field distribution around the cathode.

(3) In a case where the current is controlled by controlling a filament current of the tube to control cathode temperature, the control response becomes as low as the order of 1 sec.

The present control system in which the main scan speed is variable while the beam current is kept constant is free from the above mentioned problems.

Since, as is clear from the equation (4), the main scan clock frequencies fa to fi for obtaining optimum dose for respective sub-scan width da to di can be determined directly, it becomes possible to obtain an optimum exposure for each of pattern widths by selecting one of these frequencies according to a drawing data.

I claim:

1. An electron beam direct drawing device for drawing a predetermined pattern directly on a printed circuit board having a photoresist thereon by exposing it by electron beam scan according to a drawing pattern information obtained by a computer aided printed circuit board pattern design, comprising means for dividing said drawing pattern information over a whole area of printed circuit board into a plurality of fields each capable of being scanned by electron beam and for re-editing drawing patterns of the respective fields, means for storing the divided and then re-edited drawing pattern information, mean for generating a first control signal for reading out the stored drawing pattern information sequentially and performing a main deflection of electron beam by means of a main deflector and means for generating a second control signal including a plurality of gain amplifiers for deriving, from the stored drawing pattern information, information assigning an orientation of a pattern to be drawn and a scan width of a sub-deflection and for performing a predetermined sub-deflection scanning by means of a sub-deflector, whereby the drawing of said predetermined pattern on said printed circuit board is performed by scanning the latter with the electron beam under the control of a combination of said main deflection and said sub-deflection.

2. An electron beam direct drawing device for drawing a predetermined pattern directly on a printed circuit board having a photoresist thereon by exposing it by electron beam scan according to a drawing pattern information obtained by a computer aided printed circuit board pattern design, comprising means for storing a drawing pattern information corresponding to a field capable of being scanned by a main deflector, means for generating a first control signal for reading out the stored drawing pattern information sequentially and supplying said first control signal to said main deflector to perform a main deflection of electron beam, means for producing a plurality of signals having rectangular waveforms and having different frequencies which enables electron beam deflection scanning of said printed circuit board under control of a combination of said main deflection and said sub-deflection to make a pattern drawing of a predetermined line width possible and determines a scan speed of said main deflection, means responsive to a digital value instructing a sub-deflection scan width to select one of said rectangular signals and means for producing a main deflection scanning data in synchronism with the selected rectangular signal, whereby said main deflection scan speed is varied according to a pattern width to be drawn.

3. The electron beam direct drawing device as claimed in claim 2, wherein said digital value assigning said sub-deflection scan width is readout from said memory means for storing said drawing pattern information in real time in synchronism with one of said rectangular signal having a predetermined frequency.

4. An electron beam direct drawing device for drawing a predetermined pattern directly on a printed circuit board having a photoresist thereon by exposing it by electron beam scan according to a drawing pattern information obtained by a computer aided printed circuit board pattern design, comprising means for dividing said drawing pattern information over a whole area of printed circuit board into a plurality of fields each capable of being scanned by electron beam and for re-editing drawing patterns of the respective fields, means for storing the divided and then re-edited drawing pattern information, means for generating a first control signal for reading out the stored drawing pattern information sequentially and performing a main deflection of electron beam by means of a main deflector and means for generating a second control signal for deriving, from the stored drawing pattern information, information assigning an orientation of a pattern to be drawn and a scan width of a sub-deflection and for performing a predetermined sub-deflection scanning by means of a sub-deflector, whereby the drawing of said predetermined pattern on said printed circuit board is performed by scanning the latter with the electron beam under the control of a combination of said main deflection and said sub-deflection; wherein said means for generating said second control signal includes a plurality of gain amplifiers each determining a different sub-scan width and selects one of said gain amplifiers according to digital information of an orientation of a pattern to be drawn and a sub-deflection gain assignment among others stored in said storing means to produce said second control signal in real time.

* * * * *